(12) United States Patent
Kato et al.

(10) Patent No.: US 9,045,330 B2
(45) Date of Patent: Jun. 2, 2015

(54) MEMS ELEMENT AND METHOD OF MANUFACTURING THE SAME

(71) Applicant: KABUSHIKI KAISHA TOSHIBA, Minato-ku, Tokyo (JP)

(72) Inventors: Yuriko Kato, Yokohama (JP); Hiroaki Yamazaki, Yokohama (JP); Etsuji Ogawa, Yokohama (JP); Takayuki Masunaga, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/802,520

(22) Filed: Mar. 13, 2013

(65) Prior Publication Data
US 2013/0285163 A1 Oct. 31, 2013

(30) Foreign Application Priority Data

Apr. 27, 2012 (JP) .................................. 2012-103994

(51) Int. Cl.
 *H01L 29/84* (2006.01)
 *B81B 3/00* (2006.01)
 *H01G 5/18* (2006.01)

(52) U.S. Cl.
 CPC ....... *B81B 3/0086* (2013.01); *B81B 2201/0221* (2013.01); *H01G 5/18* (2013.01)

(58) Field of Classification Search
 CPC .................. B81B 3/0086; H01G 5/18

USPC .......................................................... 257/415
See application file for complete search history.

(56) References Cited

U.S. PATENT DOCUMENTS

| 2008/0093685 | A1 | 4/2008 | Watanabe et al. |
| 2009/0145629 | A1 | 6/2009 | Mikami et al. |
| 2011/0043960 | A1* | 2/2011 | Ikehashi ........................ 361/207 |
| 2011/0140570 | A1 | 6/2011 | Masunaga et al. |
| 2013/0285164 | A1* | 10/2013 | Saito et al. .................... 257/415 |

FOREIGN PATENT DOCUMENTS

JP 2011-114988 A 6/2011

OTHER PUBLICATIONS

Taiwanese Office Action dated Jan. 26, 2015, issued in counterpart Taiwanese Application No. 102108624.

* cited by examiner

*Primary Examiner* — Mary Wilczewski
*Assistant Examiner* — Toniae Thomas
(74) *Attorney, Agent, or Firm* — Holtz, Holtz, Goodman & Chick PC

(57) ABSTRACT

According to one embodiment, a MEMS element comprises a first electrode fixed on a substrate, and a second electrode arranged above the first electrode, facing the first electrode, and vertically movable. The second electrode includes a second opening portion that penetrates from an upper surface to a lower surface of the second electrode. The first electrode includes a first opening portion at a position corresponding to at least a part of the second opening portion, the first opening portion penetrating from an upper surface to a lower surface of the first electrode.

13 Claims, 13 Drawing Sheets

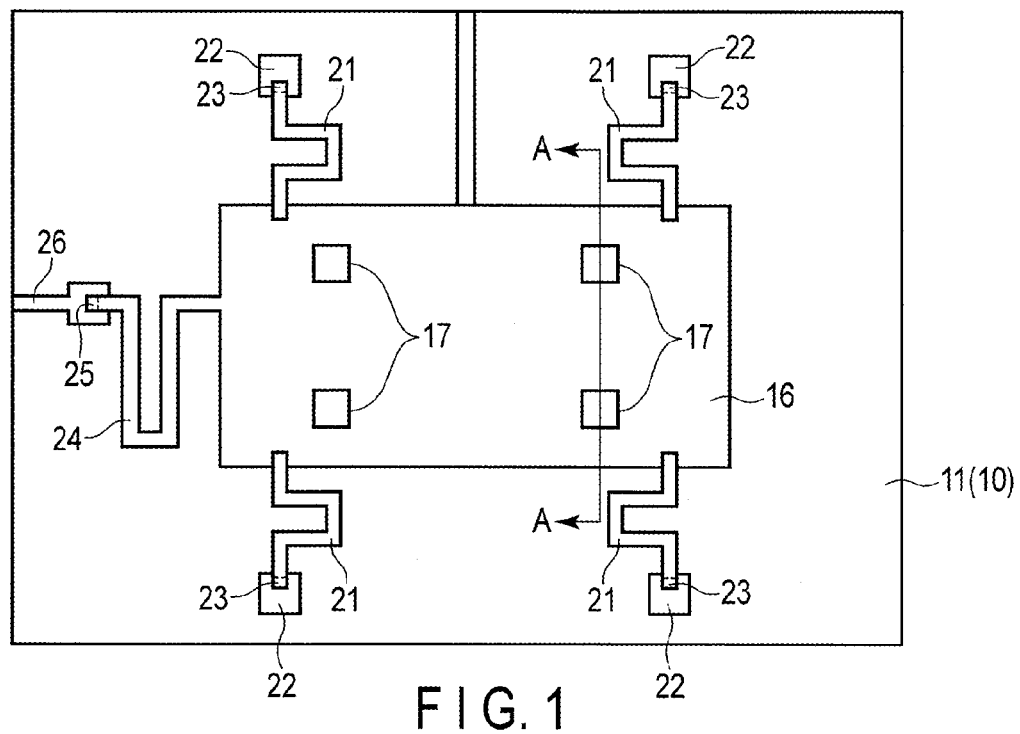
F I G. 1
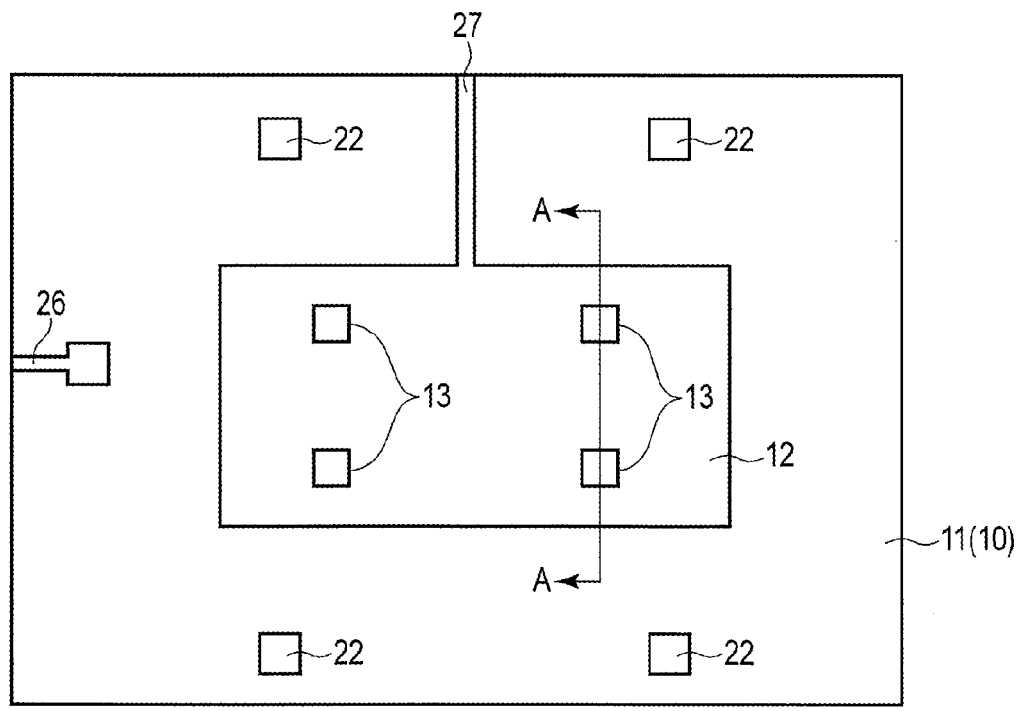
F I G. 2

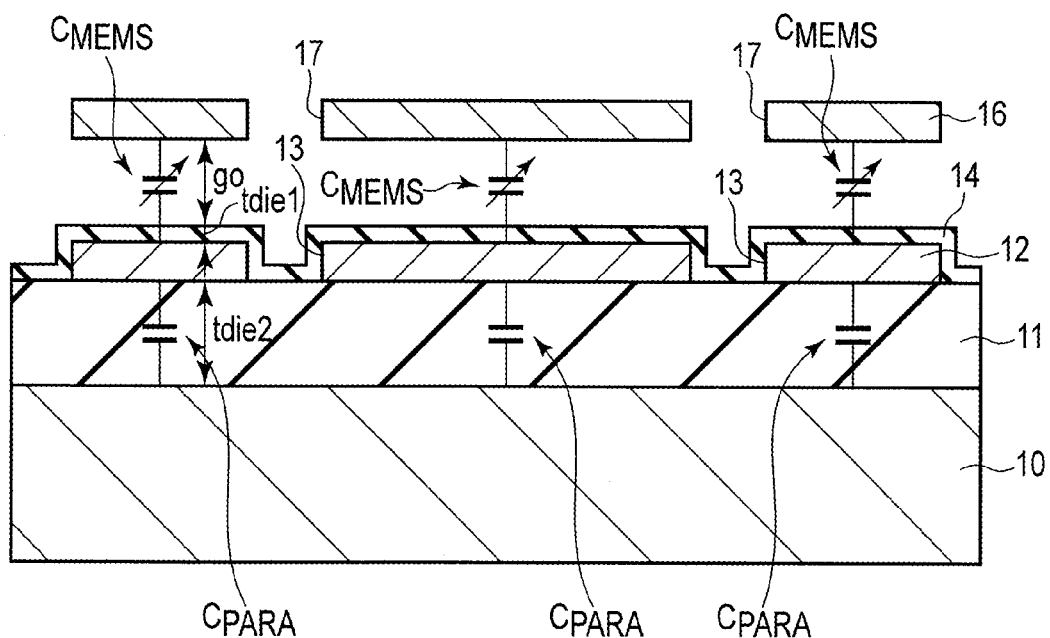
F I G. 3
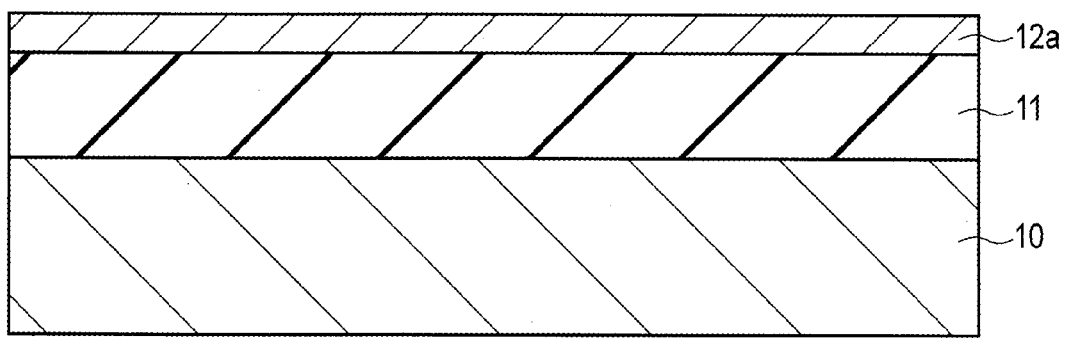
F I G. 4

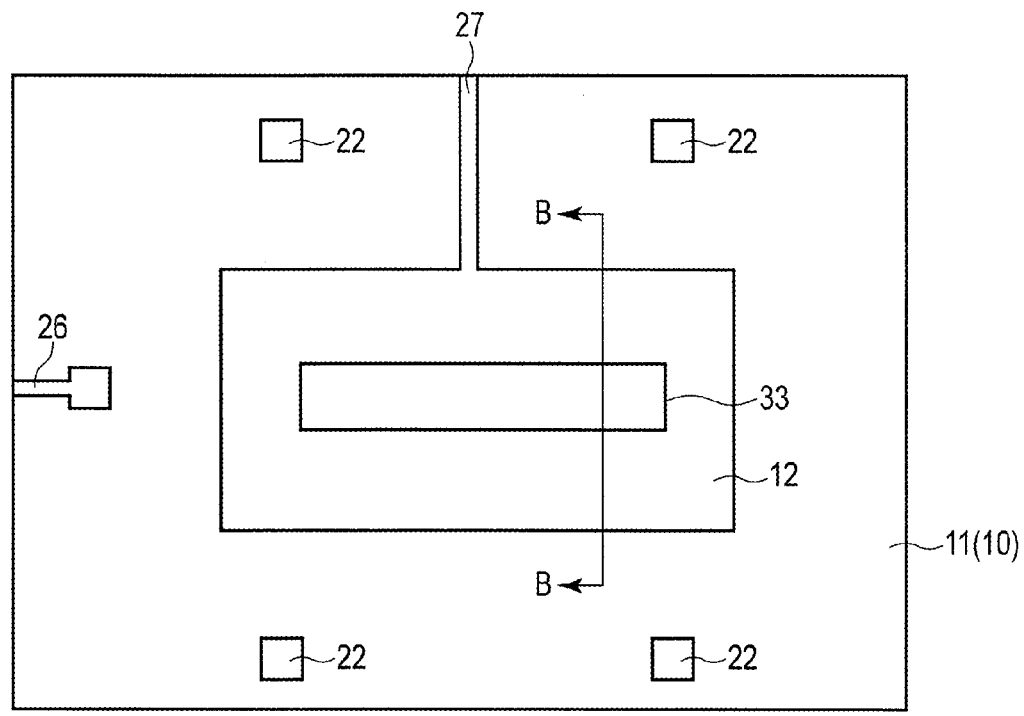
F I G. 11
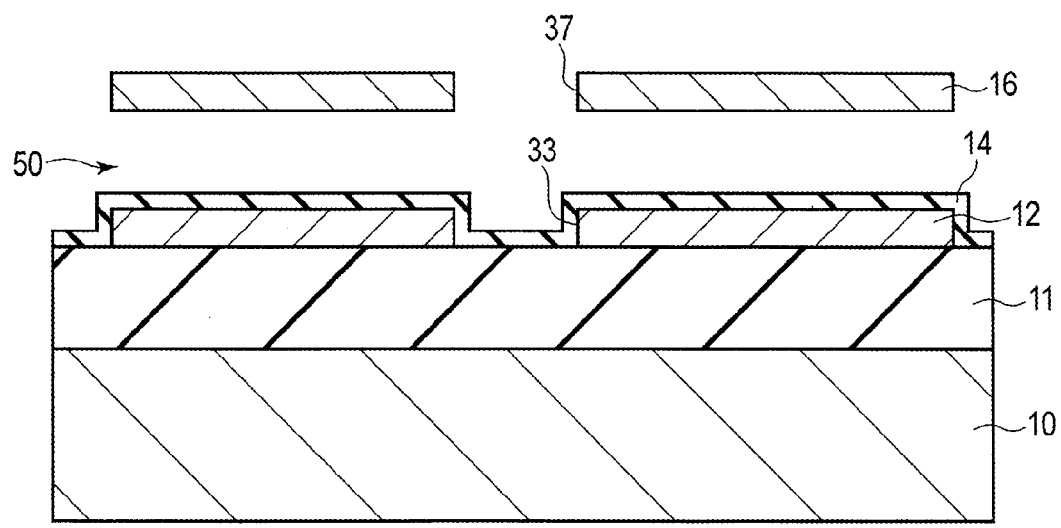
F I G. 12

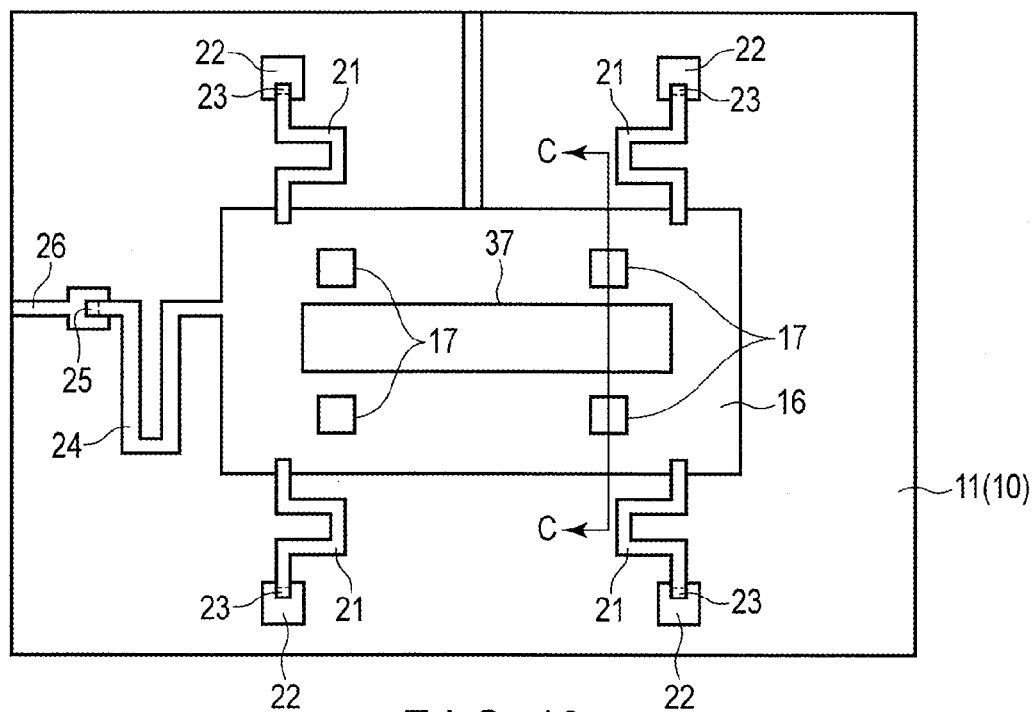
F I G. 13
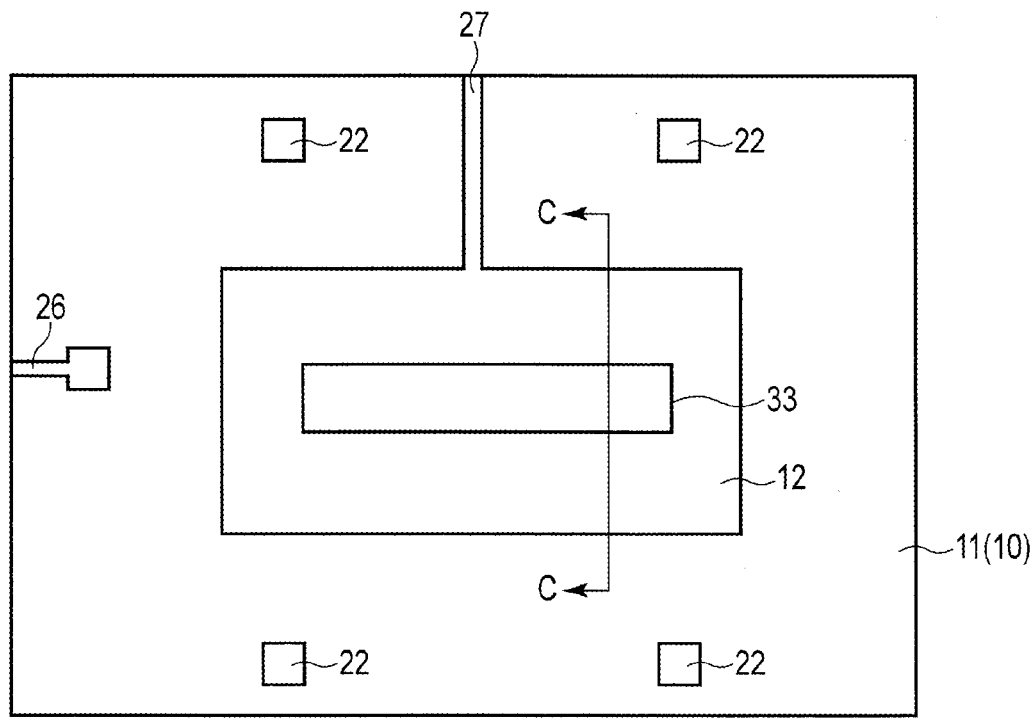
F I G. 14

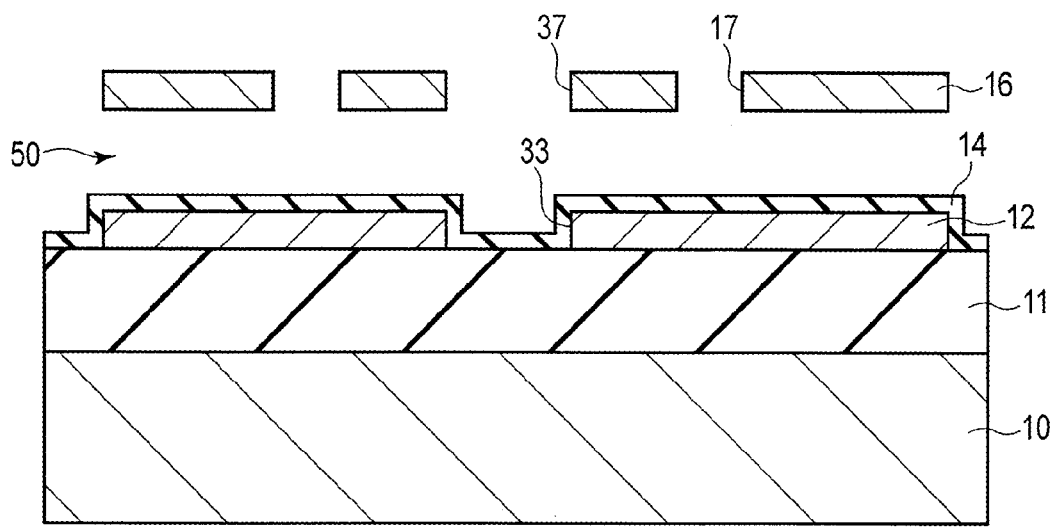
F I G. 15
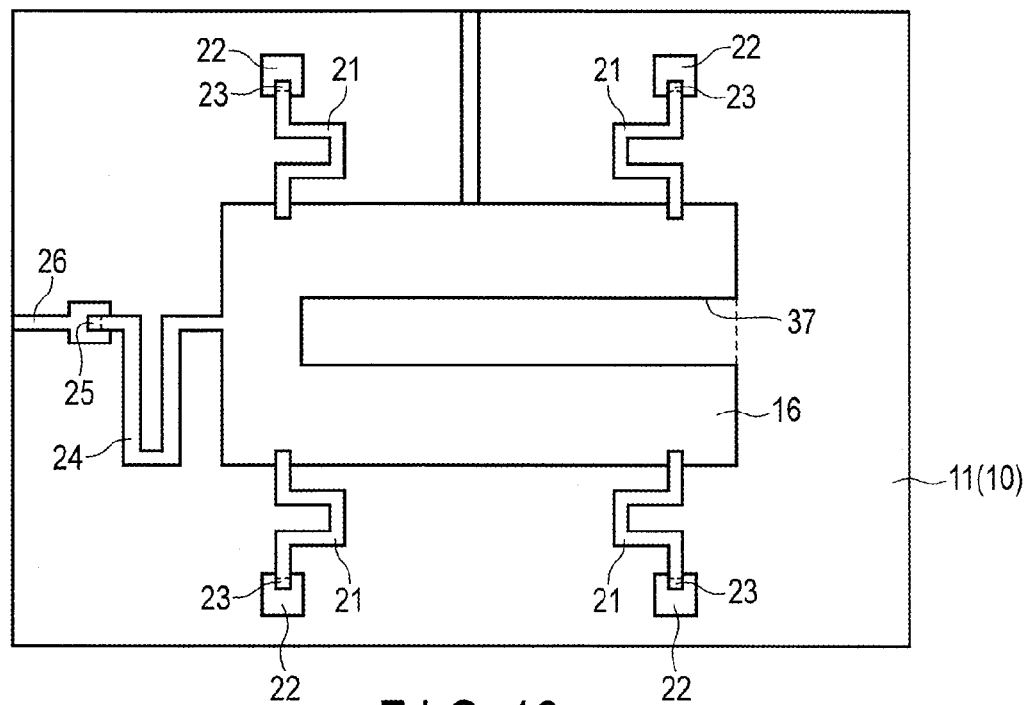
F I G. 16

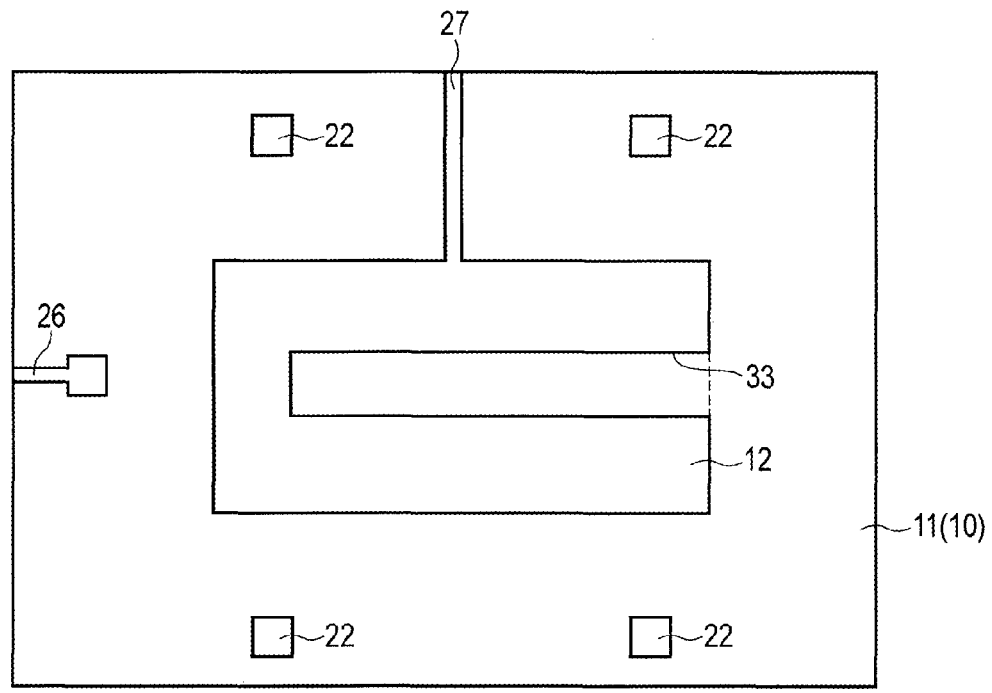
F I G. 17
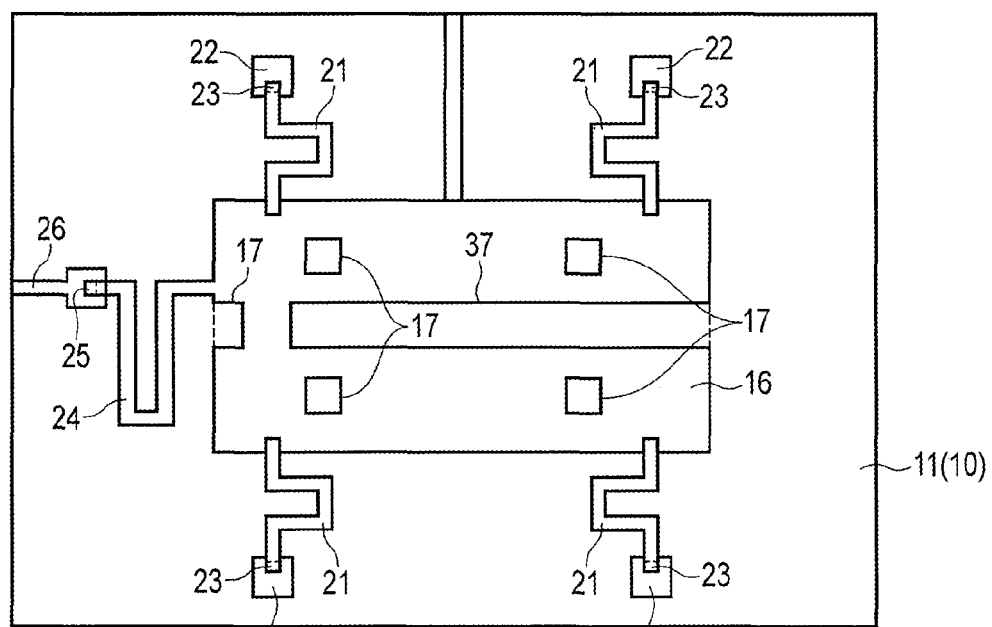
F I G. 18

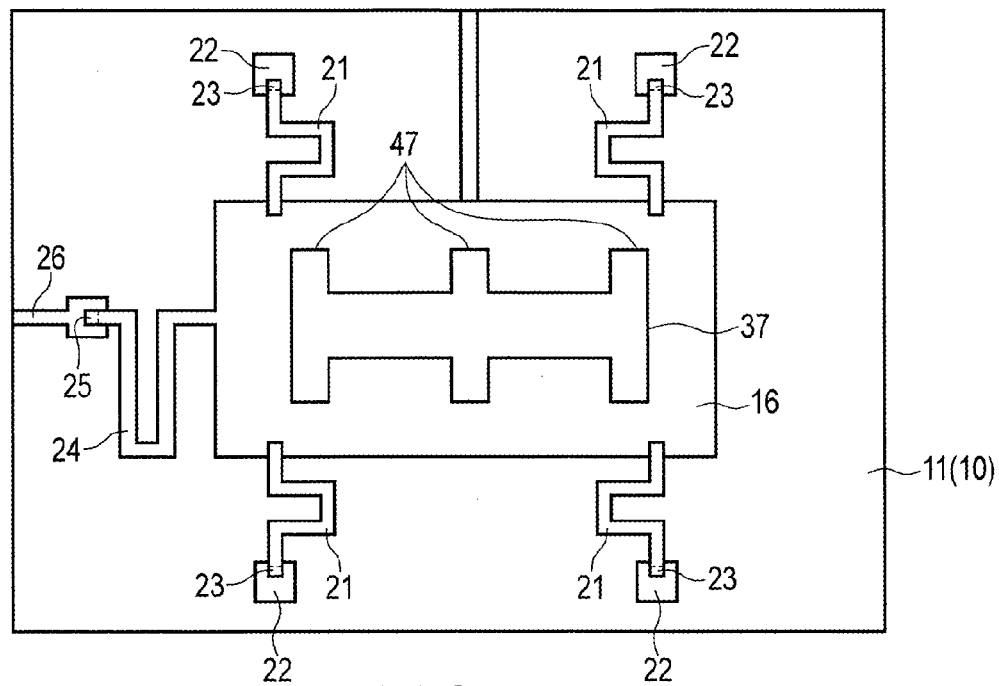
F I G. 19
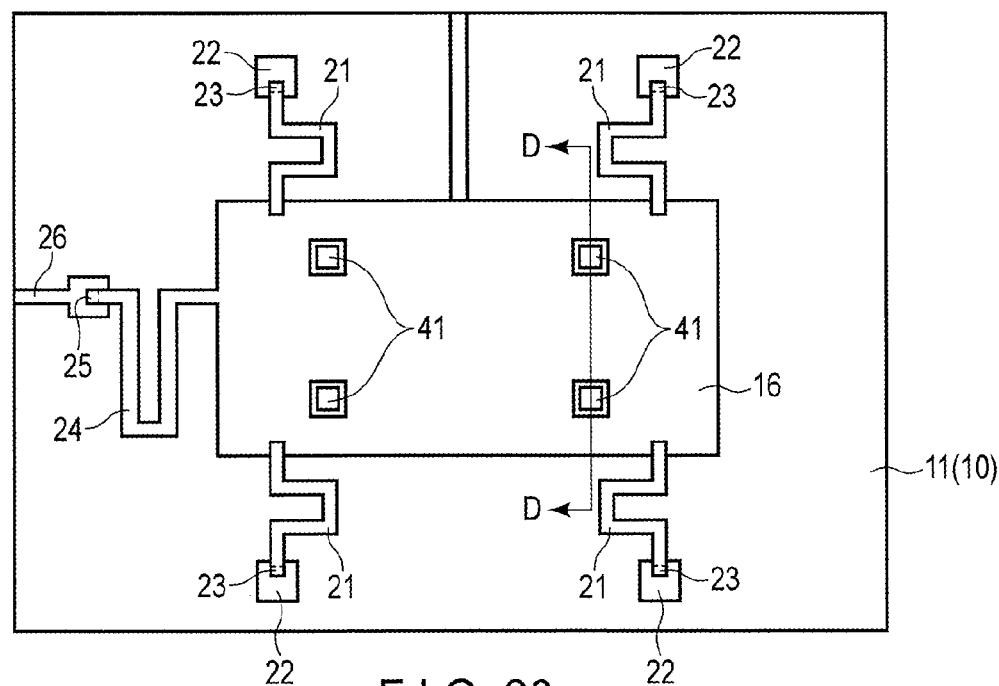
F I G. 20

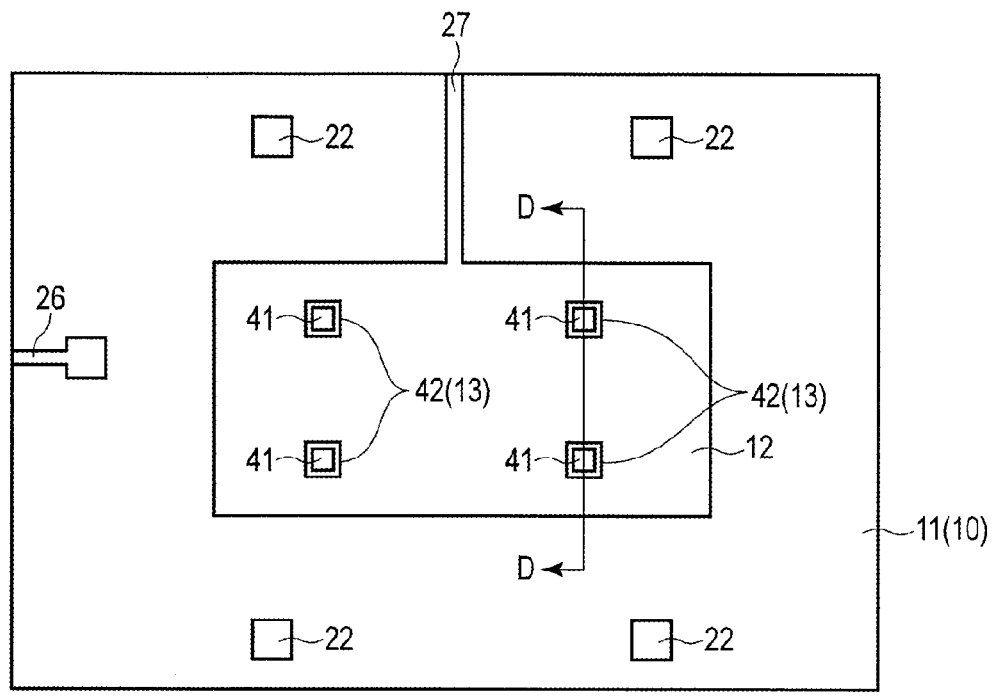
F I G. 21
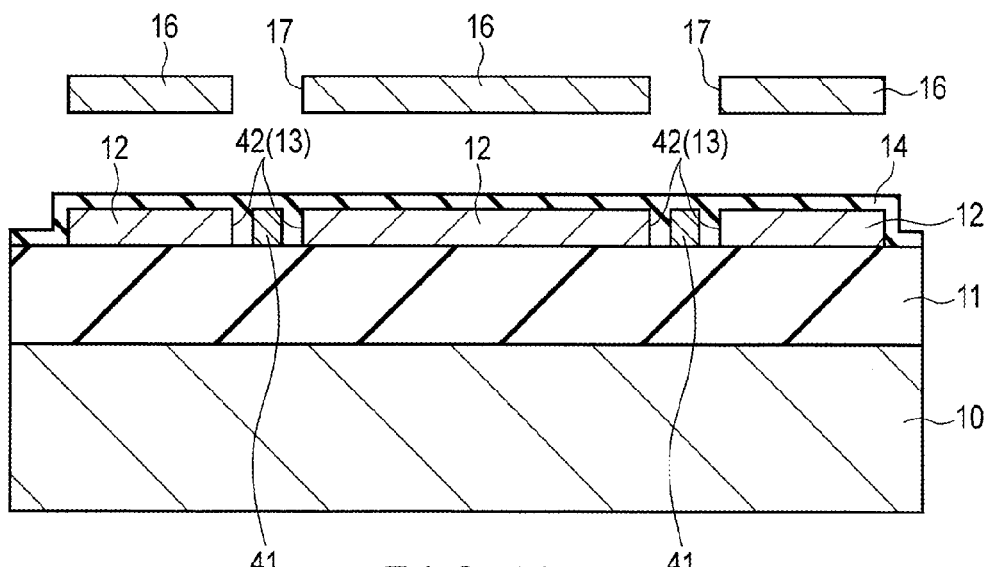
F I G. 22

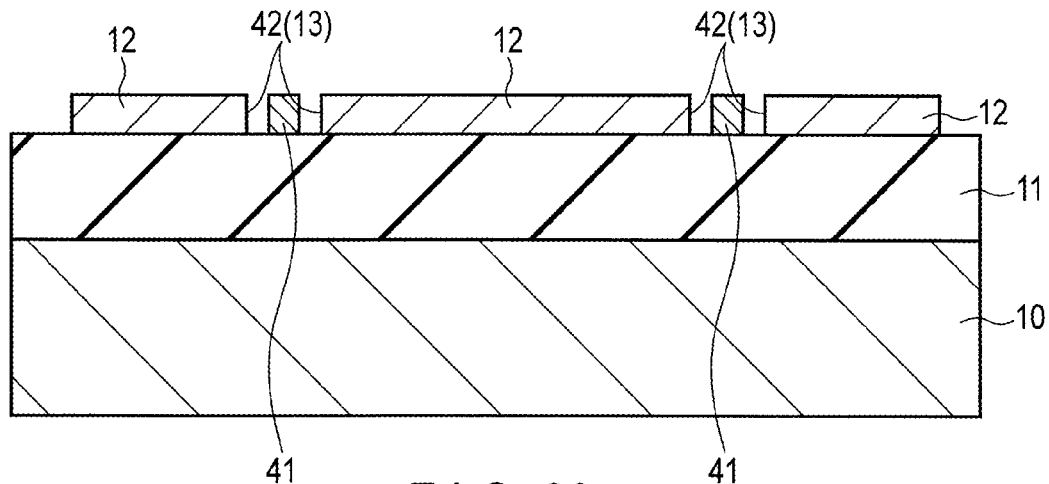
F I G. 23
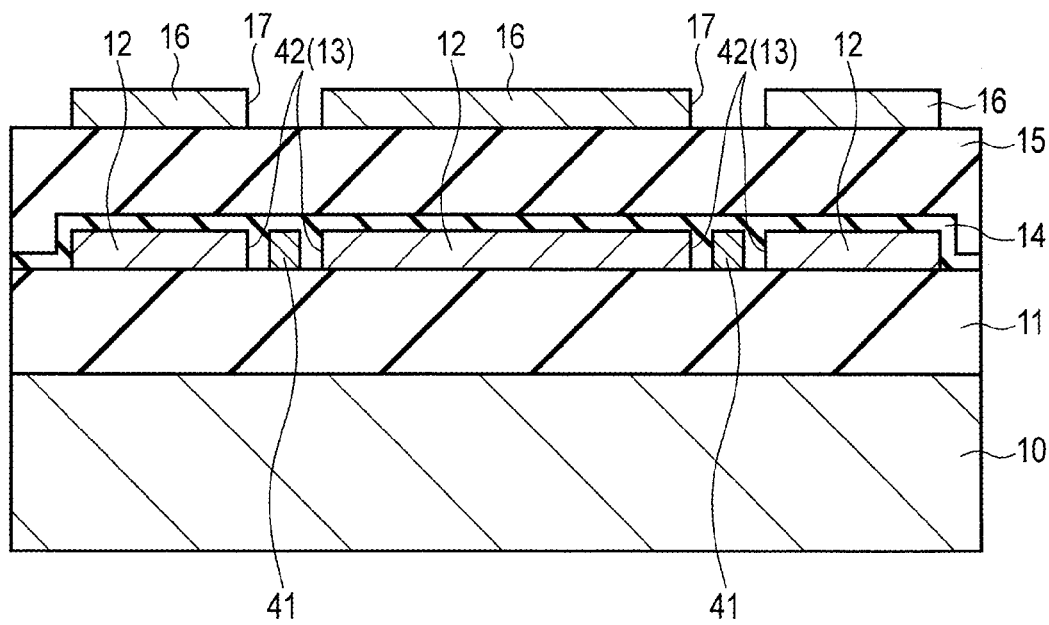
F I G. 24

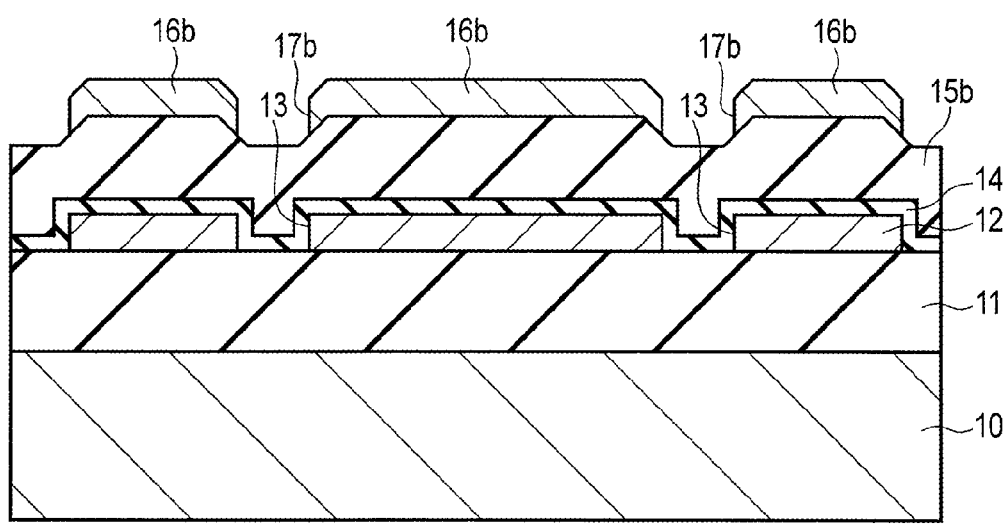
F I G. 25

MEMS ELEMENT AND METHOD OF MANUFACTURING THE SAME

CROSS-REFERENCE TO RELATED APPLICATIONS

This application is based upon and claims the benefit of priority from Japanese Patent Application No. 2012-103994, filed Apr. 27, 2012, the entire contents of which are incorporated herein by reference.

FIELD

Embodiments described herein relate generally to a MEMS element.

BACKGROUND

A MEMS (Micro Electro Mechanical Systems) element having a mechanically movable portion is proposed. The MEMS element includes a fixed lower electrode and an upper electrode vertically movable. By changing a capacitance between the lower electrode and the upper electrode, it can be adapted to devices such as a pressure sensor, a variable capacitor, or a micro pump, for example.

However, in the MEMS element, an occurrence of parasitic capacitance is problematic. The parasitic capacitance is generated dominantly between the lower electrode and a semiconductor substrate, and becomes larger in proportion to an area of the lower electrode. That is, in order to reduce the parasitic capacitance, an area reduction of the lower electrode becomes necessary.

BRIEF DESCRIPTION OF THE DRAWINGS

FIG. 1 is a plan diagram showing a structure of a MEMS element of a first embodiment, which is a diagram primarily showing a structure of an upper electrode;

FIG. 2 is a plan diagram showing the structure of the MEMS element of the first embodiment, which is a diagram primarily showing a structure of a lower electrode;

FIG. 3 is a cross sectional diagram showing a structure of the MEMS element of the first embodiment;

FIGS. 4, 5, 6, and 7 are cross sectional diagrams showing a manufacturing process of the MEMS element of the first embodiment;

FIG. 11 is a plan diagram showing Modification Example 1 of the structure of the MEMS element of the first embodiment, which is a diagram primarily showing a structure of a lower electrode;

FIG. 12 is a cross sectional diagram showing Modification Example 1 of the structure of the MEMS element of the first embodiment;

FIG. 13 is a plan diagram showing a modification 2 of the structure of the MEMS element of the first embodiment, which is a diagram primarily showing a structure of an upper electrode;

FIG. 14 is a plan diagram showing Modification Example 2 of the structure of the MEMS element of the first embodiment, which is a diagram primarily showing a structure of a lower electrode;

FIG. 15 is a cross sectional diagram showing Modification Example 2 of the structure of the MEMS element of the first embodiment;

FIG. 16 is a plan diagram showing a modification 3 of the structure of the MEMS element of the first embodiment, which is a diagram primarily showing a structure of an upper electrode;

FIG. 17 is a plan diagram showing Modification Example 3 of the structure of the MEMS element of the first embodiment, which is a diagram primarily showing a structure of a lower electrode;

FIG. 18 is a plan diagram showing a modification 4 of the structure of the MEMS element of the first embodiment, which is a diagram primarily showing a structure of an upper electrode;

FIG. 19 is a plan diagram showing Modification Example 5 of the structure of the MEMS element of the first embodiment, which is a diagram primarily showing a structure of an upper electrode;

FIG. 20 is a plan diagram showing a structure of a MEMS element of a second embodiment, which is a diagram primarily showing a structure of an upper electrode;

FIG. 21 is a plan diagram showing the structure of the MEMS element of the second embodiment, which is a diagram primarily showing a structure of a lower electrode;

FIG. 22 is a cross sectional diagram showing the structure of the MEMS element of the second embodiment;

FIGS. 23 and 24 are cross sectional diagrams showing a manufacturing process of the MEMS element of the second embodiment; and FIG. 25 is a cross sectional diagram showing a manufacturing process of a MEMS element of a comparative example 2.

DETAILED DESCRIPTION

Figure 5:
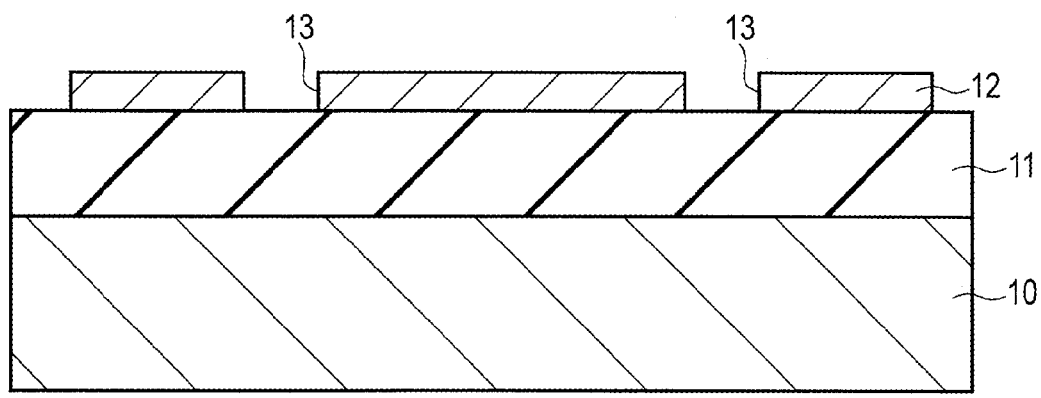

In general, according to one embodiment, a MEMS element comprises: a first electrode fixed on a substrate; and a second electrode arranged above the first electrode, facing the first electrode, and vertically movable. The second electrode includes a second opening portion that penetrates from an upper surface to a lower surface of the second electrode. The first electrode includes a first opening portion at a position corresponding to at least a part of the second opening portion, the first opening portion penetrating from an upper surface to a lower surface of the first electrode.

Hereinbelow, embodiments will be described with reference to the drawings. In the drawings, the same portions will be given the same reference signs. Further, an overlapping explanation will be given as needed.

First Embodiment

A MEMS element of the first embodiment will be described with reference to FIGS. 1, 2, 3, 4, 5, 6, 7, 8, 9, 10, 11, 12, and 13. In the first embodiment, an upper electrode 16 includes a second opening portion (holes 17, slits 37) for removing a sacrificing layer 15, and a lower electrode 12 includes a first opening portion (holes 13, slits 33) at a position corresponding to the second opening portion. Due to this, an area of the lower electrode 12 can be reduced, and a reduction of a parasitic capacitance can be obtained. Hereinbelow, the first embodiment will be described in detail.

[Structure]

Firstly, the structure of the MEMS element of the first embodiment will be described with reference to FIGS. 1, 2, and 3.

FIG. 1 is a plan diagram showing the structure of the MEMS element of the first embodiment, which is a diagram primarily showing a structure of the upper electrode 16. FIG. 2 is a plan diagram showing the structure of the MEMS element of the first embodiment, which is a diagram primarily showing a structure of the lower electrode 12. FIG. 3 is a cross sectional diagram showing the structure of the MEMS element of the first embodiment, which is a cross sectional diagram along a line A-A in FIGS. 1 and 2.

As shown in FIGS. 1, 2, 3, the MEMS element of the first embodiment includes the lower electrode 12 provided on an interlayer insulating layer 11 on a semiconductor substrate 10, and the upper electrode 16.

The semiconductor substrate 10 is for example a silicon substrate. The interlayer insulating layer 11 is configured for example of silicon oxide ($SiO_X$) that uses $SiH_4$ and TEOS (Tetra Ethyl Ortho Silicate) as a material. In the below description, the semiconductor substrate 10 and the interlayer insulating layer 11 may be termed a substrate.

Elements such as a field effect transistor and the like may be provided on a surface of the semiconductor substrate 10. Such elements configure a logic circuit, or a memory circuit. The interlayer insulating layer 11 is provided on the semiconductor substrate 10 so as to cover such circuits. Thus, the MEMS element is provided above the circuits on the semiconductor substrate 10.

Notably, for example, a circuit that becomes a source of noise such as an oscillator is preferably not disposed under the MEMS element. Further, a shielding metal may be provided between the semiconductor substrate 10 and the interlayer insulating layer 11, and the noise from a circuit on a lower layer can be prevented from being propagated to the MEMS element.

The lower electrode 12 is formed on the substrate, and is fixed thereto. The lower electrode 12 has a flat plate-shape parallel to the surface of the substrate, for example. The lower electrode 12 is configured for example of aluminum (Al), an alloy dominantly containing Al, copper (Cu), gold (Au), or platinum (Pt). The lower electrode 12 is connected to a wiring 27 configured of the same material as the lower electrode 12, and is connected to various circuits via the wiring 27. On a surface of the lower electrode 12, a lower electrode protecting layer 14 configured for example of $SiO_X$, silicon nitride (SiN), or a high-k material having a higher dielectric constant than $SiO_X$ and SiN is formed.

The upper electrode 16 is formed above the lower electrode 12, is supported in a midair state, and is vertically movable (in a direction perpendicular to the substrate). The upper electrode 16 has a flat plate-like shape parallel to the surface of the substrate 10, and is disposed opposing the lower electrode 12. That is, the upper electrode 16 overlaps with the lower electrode 12 in a plane (plane parallel to the surface of the substrate 10; hereafter simply referred to as a plane) extending in a first direction (the horizontal direction in FIGS. 1 and 2 (long direction)) and a second direction orthogonal to the first direction (the vertical direction in FIGS. 1 and 2 (short direction)). The upper electrode 16 is configured for example of Al, an alloy dominantly containing Al, Cu, Au, or Pt. That is, the upper electrode 16 is configured of a ductile material. The ductile material is a material that, in a case of destruction by applying stress to a member formed of the material, is destroyed after a large plastic deformation (stretching) occurs in the member. However, no limitation is made hereto, and the upper electrode 16 may be configured of a brittle material such as tungsten (W).

Notably, in the drawings, although the shapes of the holes in the plan of the lower electrode 12 and the upper electrode 16 are rectangular, no limitation is made hereto, and the shapes may be square, circular, or elliptical.

A first spring portion 24 and a plurality of second spring portions 21 are connected to the movable upper electrode 16 supported in midair. The first spring portion 24 and the second spring portions 21 are configured of different materials.

One end of the first spring portion 24 is connected to one end (end portion) of the upper electrode 16 in the first direction. The first spring portion 24 is for example formed integrally with the upper electrode 16. That is, the upper electrode 16 and the first spring portion 24 form a single layer structure of being connected as a single component, and are formed at the same level. The first spring portion 24 has a meandering plan shape, for example. In other words, the first spring portion 24 is formed narrow and long, and has a meandering shape.

The first spring portion 24 is configured for example of a ductile material having conductivity, and is configured of the same material as the upper electrode 16. That is, the first spring portion 24 is configured of a metal material such as Al, an alloy dominantly containing Al, Cu, Au, or Pt, for example.

A first anchoring portion 25 is connected to the other end of the first spring portion 24. The upper electrode 16 is supported by the first anchoring portion 25. The first anchoring portion 25 is for example formed integrally with the first spring portion 24. Due to this, the first anchoring portion 25 is configured for example of a ductile material having conductivity, and is configured of the same material as the upper electrode 16 and the first spring portion 24. The first anchoring portion 25 is configured for example of a metal material such as Al, an alloy dominantly containing Al, Cu, Au, or Pt. Notably, the first anchoring portion 25 may be configured of a different material from the upper electrode 16 and the first spring portion 24.

The first anchoring portion 25 is provided on a wiring 26. The wiring 26 is provided on the interlayer insulating layer 11, and is configured of the same material as the lower electrode 12. A surface of the wiring 26 is covered by an insulating layer not shown. The insulating layer is formed for example integrally with the lower electrode protecting layer 14. The insulating layer is provided with an opening portion, and the first anchoring portion 25 is directly in contact with the wiring 26 through this opening portion. That is, the upper electrode 16 is electrically connected to the wiring 26 via the first spring portion 24 and the first anchoring portion 25, and is connected to various circuits. Due to this, a potential (voltage) is supplied to the upper electrode 16 via the wiring 26, the first anchoring portion 25, and the first spring portion 24.

Further, one second spring portion 21 is connected to a respective one of four corners (respective end portions of the first direction and the second direction) of the upper electrode 16. Notably, although four second spring portions 21 are provided in this example, the number is not limited hereto.

One end of each second spring portion 21 is provided on the upper electrode 16. Due to this, contact portions of the second spring portions 21 and the upper electrode 16 form laminate structures. The other end of each second spring portion 21 is provided on a second anchoring portion 23. Due to this, contact portions of the second spring portions 21 and the second anchoring portions 23 form laminate structures. The upper electrode 16 is supported by the second anchoring portions 23. Further, the second spring portions 21 are in a midair state between the upper electrode 16 and the second anchoring portions 23, and are formed at the same level as the upper electrode 16. Further, the second spring portions 21 for example has a meandering plan shape between the upper electrode 16 and the second anchoring portions 23.

The second anchoring portions 23 are provided on dummy electrodes 22. The dummy electrodes 22 are provided on the interlayer insulating layer 11, and are configured of the same material as the lower electrode 12. The dummy electrodes 22 are insulatingly separated from the circuits and the like, and are in a floating state. Surfaces of the dummy electrodes 22 are covered for example by an insulating layer integrally formed with the lower electrode protecting layer 14. The insulating layer is provided with opening portions, and the second anchoring portions 23 are directly in contact with the dummy electrodes 22 through the opening portions. Notably, the second anchoring portions 23 do not have to make direct contact with the dummy electrodes 22.

The second spring portions 21 are configured for example of a brittle material. The brittle material is a material that, in the case of destroying by applying stress to a member formed of the material, is destroyed with hardly any plastic deformation (stretching) in the member.

By using the brittle material as the second spring portions 21, a phenomenon of creep at the spring portions that occurs when the ductile material is used can be prevented. Notably, the phenomenon of creep is a phenomenon in which a warpage (deformation of shape) in a member becomes large over time or when a stress is applied to the member.

Notably, the second spring portions 21 may be configured of the ductile material, and in a case where the second spring portions 21 are formed of a conductive material, the first spring portion 24 does not have to be formed.

In the first embodiment, the upper electrode 16 includes the holes 17 that penetrate from an upper surface to a lower surface of the upper electrode 16. The holes 17 are for removing the sacrificing layer 15 formed between the lower electrode 12 and the upper electrode 16 in a manufacturing process to be described later. That is, the sacrificing layer 15 can be removed by an isotropic etching via the holes 17.

Notably, in the drawings, although the upper electrode 16 includes four holes 17, no limitation is made hereto, and one to three, or five or more holes may be provided. Further, in a case of dividing the upper electrode 16 into a plurality of regions, the plurality of holes 17 are preferably disposed evenly in each region. Due to this, an etching rate of the sacrificing layer 15 can be made large. Further, although the plan shape of the holes in the upper electrode 16 is square, no limitation is made hereto, and the shape may be rectangular, circular, or elliptical.

On the other hand, the lower electrode 12 includes the holes 13 that penetrate from an upper surface to a lower surface of the lower electrode 12. The holes 13 are formed at positions corresponding to the holes 17 in a plan view. That is, the holes 13 and the holes 17 overlap in the plan view. In other words, the lower electrode 12 other than the holes 13 and the upper electrode 16 other than the holes 17 overlap. Further, although it is preferable that an area of the holes 13 is equal to an area of the holes 17 or larger than the area of the holes 17, no limitation is made hereto, and the area of the holes 13 may be smaller than the area of the holes 17. At this occasion, in the plan view, the holes with the larger area (for example, the holes 13) are formed to include the holes with the smaller area (for example, the holes 17) in the plan view. Further, although the plan shape of the holes in the lower electrode 12 is square, similar to the upper electrode 16, no limitation is made hereto, and the shape may be rectangular, circular, or elliptical.

A substantial capacity of the MEMS element is proportional to an overlapping area of the upper electrode 16 and the lower electrode 12, and the parasitic capacitance of the MEMS element is proportional to the area of the lower electrode 12. That is, while the overlapping area is enlarged in order to make the substantial capacity of the MEMS element large, the area of the lower electrode 12 needs to be made small in order to make the parasitic capacitance small.

In the first embodiment, by providing the holes 13 in the lower electrode 12 at the positions corresponding to the holes 17 of the upper electrode 16, the parasitic capacitance can be reduced while not reducing the substantial capacity of the MEMS element. Details of the substantial capacity and the parasitic capacitance in the MEMS element will be described later.

[Manufacturing Method]

Next, a manufacturing method of the MEMS element of the first embodiment will be described with reference to FIGS. 4, 5, 6, and 7. Here, a forming method of the holes 13 provided in the lower electrode 12 and the holes 17 provided in the upper electrode 16 will primarily be described.

FIGS. 4, 5, 6, and 7 are cross sectional diagrams showing the manufacturing process of the MEMS element of the first embodiment, which are cross sectional diagrams along the line A-A in FIGS. 1 and 2.

Firstly, as shown in FIG. 4, the interlayer insulating layer 11 is formed on the semiconductor substrate 10 for example by a P-CVD (Plasma Enhanced Chemical Vapor Deposition) method. The interlayer insulating layer 11 is configured for example of $SiO_X$ that uses $SiH_4$ and TEOS as the material. Thereafter, a metal layer 12a is formed evenly on the interlayer insulating layer 11 for example by a sputtering method. The metal layer 12a is configured for example of Al, an alloy dominantly containing Al, Cu, Au, or Pt.

Next, as shown in FIG. 5, the metal layer 12a is patterned for example by lithography and RIE (Reactive Ion Etching). Due to this, the lower electrode 12 is formed on the interlayer insulating layer 11. Further, concurrently, the dummy electrodes 22, and the wirings 26, 27 are formed on the interlayer insulating layer 11.

At this occasion, the holes 13 that penetrate from the upper surface to the lower surface are formed in the lower electrode 12. The holes 13 are formed at the positions corresponding to the holes 17 formed in the upper electrode 16 to be described later. Although the shape of the holes 13 in the plan view is square, no limitation is made hereto, and the shape may be rectangular, circular, or elliptical.

Figure 6:
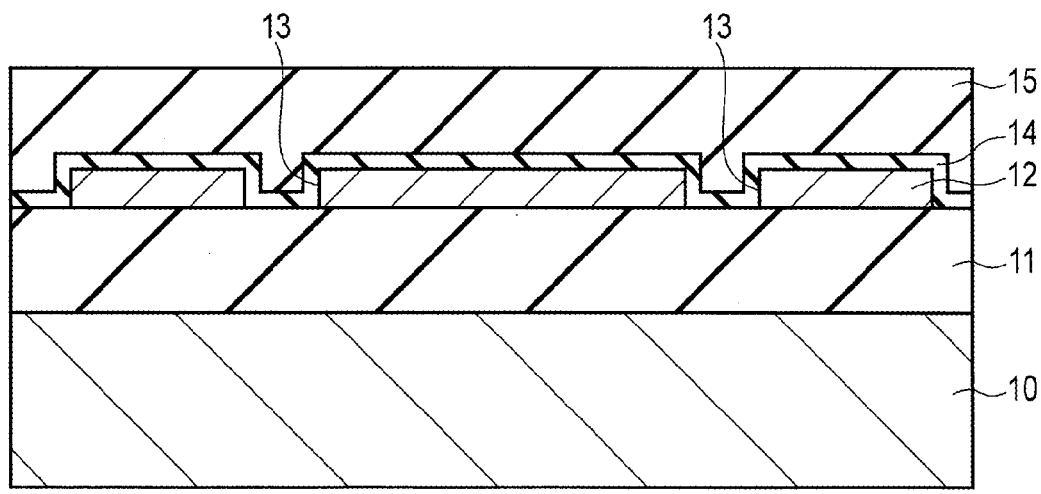

Next, as shown in FIG. 6, the lower electrode protecting layer 14 is formed on an entire surface for example by the P-CVD method. Due to this, the surfaces of the lower electrode 12, the dummy electrodes 22, and the wirings 26, 27 are covered by the lower electrode protecting layer 14. The lower electrode protecting layer 14 is configured for example of $SiO_X$, SiN, or the high-k material. Thereafter, the lower electrode protecting layer 14 is etched for example by the lithography and the RIE. Due to this, the opening portions are formed in the lower electrode protecting layer 14 positioned above the wiring 26 and the dummy electrodes 22, whereby the wiring 26 and the dummy electrodes 22 are exposed. Notably, at this occasion, the dummy electrodes 22 may not be exposed.

Next, the sacrificing layer 15 is applied on the lower electrode protecting layer 14. The sacrificing layer 15 is configured of an organic material such as polyimide. Thereafter, the sacrificing layer 15 is patterned for example by the lithography and the RIE. Due to this, the sacrificing layer 15 above the opening portions of the lower electrode protecting layer 14 is etched, and the wiring 26 and the dummy electrodes 22 are exposed. In other words, opening portions that connect with the opening portions of the lower electrode protecting layer 14 are formed in the sacrificing layer 15.

Figure 7:
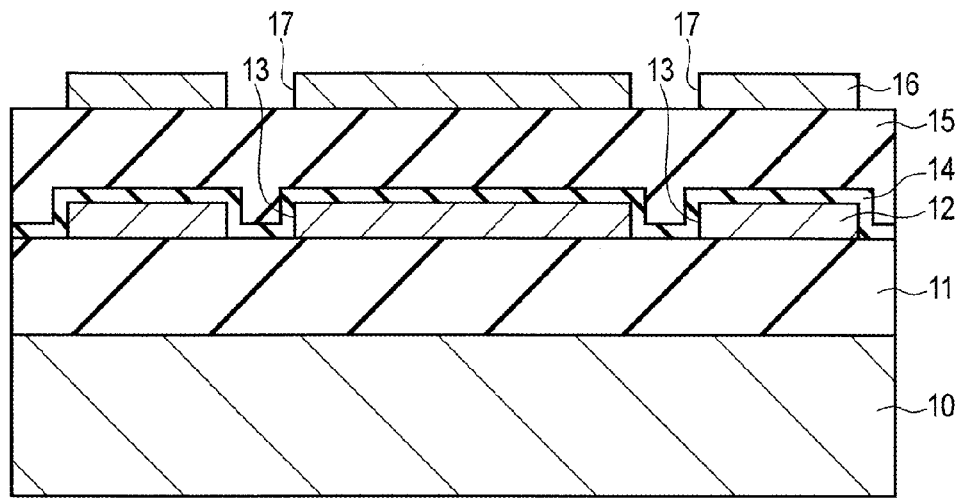

Next, as shown in FIG. 7, a metal layer is formed on an entire surface for example by the sputtering method. More specifically, the metal layer is formed on an upper surface of the sacrificing layer 15 outside the opening portions, and on side surfaces of the sacrificing layer 15 (and the lower electrode protecting layer 14) within the opening portions. Due to this, the metal layer is formed at bottom surfaces of the opening portions by being in contact with the wiring 26 and the dummy electrodes 22. The metal layer is configured for example of Al, an alloy dominantly containing Al, Cu, Au, or Pt.

Next, the metal layer is patterned for example by the lithography and a wet etching. Due to this, the upper electrode 16 that opposes the lower electrode 12 is formed on the sacrificing layer 15. Further, the second anchoring portions 23 are formed on the dummy electrodes 22 in the opening portions. Further, the first anchoring portion 25 is formed on the wiring 26 in the opening portion, and the first spring portion 24 that connects the upper electrode 16 and the first anchoring portion 25 is formed on the sacrificing layer 15.

At this occasion, the holes 17 that penetrate from the upper surface to the lower surface are formed in the upper electrode 16. The holes 17 are formed at the positions corresponding to the holes 13 formed in the lower electrode 12. Although the shape of the holes 17 in the plan view is square, no limitation is made hereto, and the shape may be rectangular, circular, or elliptical.

Notably, although the patterning of the metal layer configuring the upper electrode 16 and the like is preferably performed by the wet etching so that the sacrificing layer 15 is not etched, no limitation is made hereto. Further, generally, the RIE has a higher etching accuracy than the wet etching. Due to this, in a case of patterning the lower electrode 12 by the RIE and patterning the upper electrode 16 by the wet etching, the lower electrode 12 is preferably formed smaller than the upper electrode 16. In other words, the holes 13 provided in the lower electrode 12 are preferably formed to be larger than the holes 17 provided in the upper electrode 16. That is, by making an etching amount of the upper electrode 16 by the wet etching to be smaller than an etching amount of the lower electrode 12 by the RIE, a process variation can be reduced.

Next, after a layer configured of the brittle material is formed on an entire surface for example by the P-CVD method, the layer configured of the brittle material is etched by the lithography and the RIE. Due to this, the second spring portions 21 connected to the upper electrode 16 and the second anchoring portions 23 are formed. More specifically, the second spring portions 21 are formed to connect with the upper electrode 16, the sacrificing layer 15, and the second anchoring portions 23 thereon.

Next, as shown in FIG. 3, the sacrificing layer 15 is removed via end portion sides and the holes 17 by an isotropic dry etching such as ashing using $O_2$ and Ar. At this occasion, in the case of dividing the upper electrode 16 into the plurality of regions, an etching rate of the sacrificing layer 15 can be made large by the plurality of holes 17 being disposed evenly in each region. Due to this, the first spring portion 24, the second spring portion 21, and the upper electrode 16 are formed to be in a midair state. In other words, a movable region of the upper electrode 16 is formed between the lower electrode 12 and the upper electrode 16 (below the upper electrode 16).

Notably, in reality a movable region also needs to be formed above the upper electrode 16. In regards to a forming method of the movable region above the upper electrode 16, since it can be formed by various well-known methods, details thereof will be omitted.

For example, after having formed the second spring portions 21 using the brittle material, a sacrificing layer that is not shown is formed on the upper electrode 16, the first spring portion 24, and the second spring portions 21, and an insulating layer that is not shown is formed on the sacrificing layer. Thereafter, through holes are formed in the insulating layer by a patterning processing, and the sacrificing layer 15 and the sacrificing layer that is not shown are collectively removed by the isotropic dry etching, for example the ashing using $O_2$ and Ar. Due to this, the movable region of the upper electrode 16 is formed not only below the upper electrode 16 but also above the upper electrode 16.

Accordingly, the MEMS element of the first embodiment is formed.

Advantageous Effects

According to the first embodiment, the upper electrode 16 includes the holes 17 for removing the sacrificing layer 15, and the lower electrode 12 includes the holes 13 at the positions corresponding to the holes 17. Due to this, the following advantageous effect can be achieved.

Figure 8:
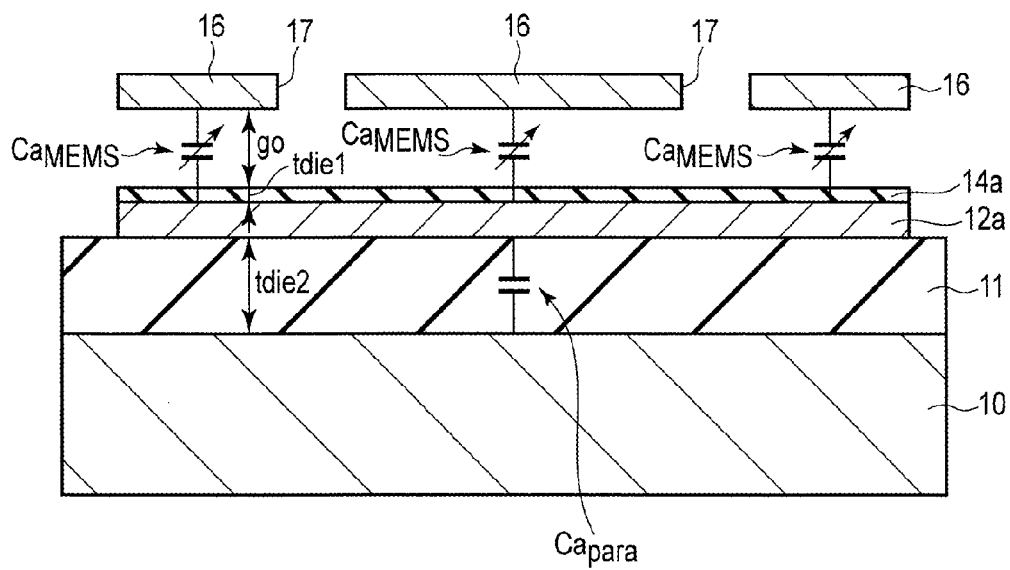
FIG. 8 is a cross sectional diagram showing a structure of a MEMS element of Comparative Example 1.

FIG. 8 is a cross sectional diagram showing a structure of a MEMS element of Comparative Example 1.

As shown in FIG. 8, what differs in the MEMS element of Comparative Example 1 from the first embodiment is that, on a substrate, a lower electrode 12a and a lower electrode protecting layer 14a are formed wholly (on an entire surface) below an upper electrode 16.

Here, as shown in FIG. 8, a capacity Ca of the MEMS element of Comparative Example 1 is expressed by the following formula (1) by using a substantial capacity $Ca_{MEMS}$ of the MEMS element (capacity between the lower electrode 12a and the upper electrode 16) and a parasitic capacitance $Ca_{PARA}$ of the MEMS element (capacity between the lower electrode 12a and a semiconductor substrate 10).

$$C_a = C_{aMEMS} + C_{aPARA} = \frac{\varepsilon_0 S_{a1}}{g_0 + \frac{t_{die1}}{\varepsilon_{die1}}} + \frac{\varepsilon_0 \varepsilon_{die2} S_{a2}}{t_{die2}} \quad (1)$$

Here, $g_0$ is a distance between an upper surface of the lower electrode protecting layer 14a and a lower surface of the upper electrode 16, $t_{die1}$ is a film thickness of the lower electrode protecting layer 14a, $t_{die2}$ is a film thickness of an interlayer insulating layer 11 (distance between a lower surface of the lower electrode 12a and an upper surface of the semiconductor substrate 10), $S_{a1}$ is an overlapping area of the lower electrode 12a and the upper electrode 16 (area of the upper electrode 16), $S_{a2}$ is an area of the lower electrode 12a, $\varepsilon_0$ is a dielectric constant in a vacuum state, $\varepsilon_{die1}$ is a relative dielectric constant of the lower electrode protecting layer 14a, and $\varepsilon_{die2}$ is a relative dielectric constant of the interlayer insulating layer 11.

With respect to this, as shown in FIG. 3, the capacity C of the MEMS element of the first embodiment is expressed by the following formula (2) by using the substantial capacity $C_{MEMS}$ of the MEMS element (capacity between the lower electrode 12 and the upper electrode 16) and the parasitic capacitance $C_{PARA}$ of the MEMS element (capacity between the lower electrode 12 and the semiconductor substrate 10).

$$C = C_{MEMS} + C_{PARA} = \frac{\varepsilon_0 S_1}{g_0 + \frac{t_{die1}}{\varepsilon_{die1}}} + \frac{\varepsilon_0 \varepsilon_{die2} S_2}{t_{die2}} \quad (2)$$

Here, $S_1$ is the overlapping area of the lower electrode 12 and the upper electrode 16, and $S_2$ is the area of the lower electrode 12.

In the MEMS element, the capacity C is made variable by changing $g_0$ by moving the upper electrode 16. That is, the MEMS element is caused to operate by making the substantial capacity $C_{MEMS}$ to be variable. On the other hand, the parasitic capacitance $C_{PARA}$ is invariable. Due to this, in the operation of the MEMS element, it is necessary to make a contribution of the variable substantial capacity $C_{MEMS}$ large and a contribution of the invariable parasitic capacitance $C_{PARA}$ small with respect to the capacity C.

As shown in the formula (2), the parasitic capacitance $C_{PARA}$ of the MEMS element is proportional to the area of the lower electrode 12. That is, the area $S_2$ needs to be made small in order to make the contribution of the parasitic capacitance $C_{PARA}$ small. In the MEMS element of the first embodiment, the lower electrode 12 includes the holes 13. Due to this, the area $S_2$ of the lower electrode 12 in the first embodiment is smaller than the area $Sa_2$ of the lower electrode 12a in Comparative Example 1 that forms the lower electrode in an unpatterned state by areas of the holes 13. Due to this, the parasitic capacitance $C_{PARA}$ in the first embodiment can be made smaller than the parasitic capacitance $Ca_{PARA}$ in Comparative Example 1.

Figure 9:
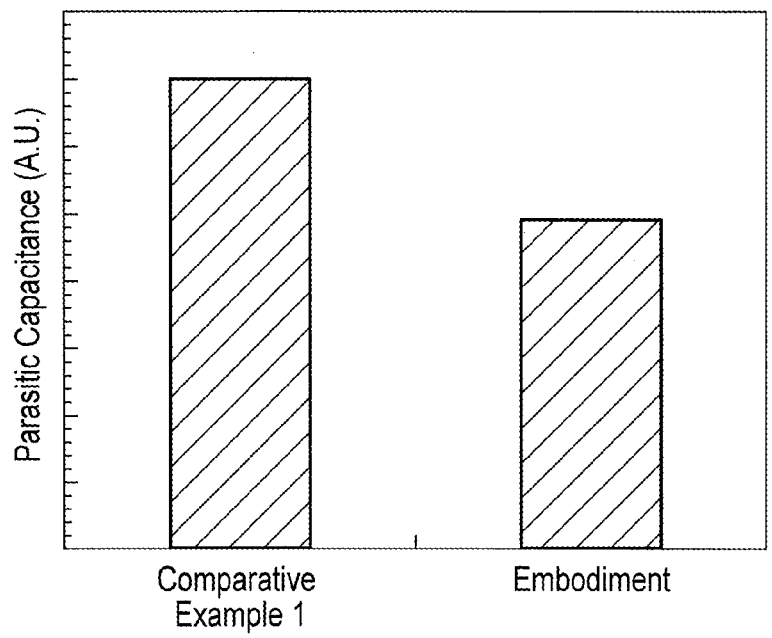
FIG. 9 is a graph showing a parasitic capacitance in Comparative Example 1 and a parasitic capacitance in the first embodiment.

More specifically, as shown in FIG. 9, the parasitic capacitance $C_{PARA}$ in the first embodiment can be reduced by about 30% relative to the parasitic capacitance $Ca_{PARA}$ in Comparative Example 1. This is because the area $S_2$ of the lower electrode 12 in the first embodiment is reduced by about 30% relative to the area $Sa_2$ of the lower electrode 12a in Comparative Example 1.

Further, as shown in the formula (2), the substantial capacity $C_{MEMS}$ of the MEMS element is proportional to the area $S_1$ by which the lower electrode 12 and the upper electrode 16 overlap. That is, the area $S_1$ should be prevented from being made too small in order to increase the contribution of the substantial capacity $C_{MEMS}$. The MEMS element of the first embodiment has the holes 13 of the lower electrode 12 provided at the positions corresponding to the holes 17 of the upper electrode 16. The holes 17 portions of the upper electrode 16 are portions that originally do not contribute to the substantial capacity $C_{MEMS}$. That is, even if the holes 13 of the lower electrode 12 are formed at the positions corresponding to the holes 17 of the upper electrode 16, the overlapping area $S_1$ in the first embodiment is not reduced, and can be made to be of about the same size as the overlapping area $Sa_1$ in Comparative Example 1.

That is, in the first embodiment, the parasitic capacitance $C_{PARA}$ can be reduced while not reducing the substantial capacity $C_{MEMS}$ by the lower electrode 12 being provided with the holes 13 at the positions corresponding to the holes 17 of the upper electrode 16. Due to this, the contribution of the substantial capacity $C_{MEMS}$ can be made larger, and the contribution of the parasitic capacitance $C_{PARA}$ can be made smaller.

Notably, the area of the lower electrode 12 and the area of the upper electrode 16 may be of about the same size, the area of the lower electrode 12 may be smaller than the area of the upper electrode 16, and the area of the lower electrode 12 may be larger than the area of the upper electrode 16. In other words, the areas of the holes 13 and the areas of the holes 17 may be of about the same size, the areas of the holes 13 may be larger than the areas of the holes 17, and the areas of the holes 13 may be smaller than the areas of the holes 17.

More specifically, in considering making the contribution of the substantial capacity $C_{MEMS}$ large and the contribution of the parasitic capacitance $C_{PARA}$ small, it is preferable that the area of the lower electrode 12 and the area of the upper electrode 16 are of about the same size. Further, in considering making the contribution of the parasitic capacitance $C_{PARA}$ small, it is preferable that the area of the lower electrode 12 is made smaller than the area of the upper electrode 16. However, no limitation is made hereto, and the area of the lower electrode 12 and the area of the upper electrode 16 (the areas of the holes 13 and the areas of the holes 17) can suitably be set.

Further, the first embodiment can be adapted to a MEMS element having the holes 17 in the upper electrode 16 for removing the sacrificing layer 15. As such a MEMS element, for example, a variable capacitor having an upper electrode 16 with a relatively large area exists.

Modification Example 1

Next, Modification Example 1 of the structure of the MEMS element of the first embodiment will be described with reference to FIGS. 10, 11, and 12.

Figure 10:
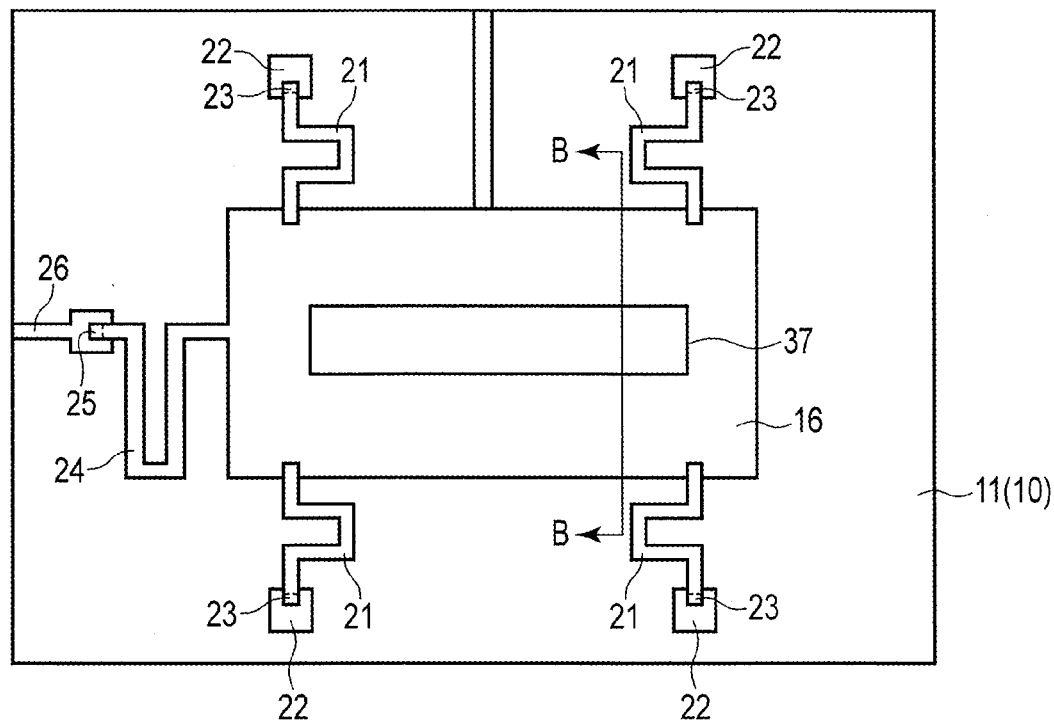
FIG. 10 is a plan diagram showing a modification 1 of the structure of the MEMS element of the first embodiment, which is a diagram primarily showing a structure of an upper electrode.

FIG. 10 is a plan diagram showing Modification Example 1 of the structure of the MEMS element of the first embodiment, which is a diagram primarily showing a structure of an upper electrode 16. FIG. 11 is a plan diagram showing Modification Example 1 of the structure of the MEMS element of the first embodiment, which is a diagram primarily showing a structure of a lower electrode 12. FIG. 12 is a cross sectional diagram showing Modification Example 1 of the structure of the MEMS element of the first embodiment, which is a cross sectional diagram along a line B-B in FIGS. 10 and 11.

As shown in FIGS. 10, 11, and 12, in Modification Example 1, an upper electrode 16 includes a slit 37 that penetrates from an upper surface to a lower surface of the upper electrode 16. The slit 37 is for removing a sacrificing layer 15 formed between the upper electrode 16 and a lower electrode 12 in a manufacturing process. That is, the sacrificing layer 15 can be removed by an isotropic etching through the slit 37.

The slit 37 is formed to extend in a long direction of the upper electrode 16 in a plan view. Further, the slit 37 is formed at a center portion in a short direction of the upper electrode 16 in the plan view. Notably, a slit herein refers to those having a larger area than the aforementioned hole, and refers to those with a rectangular or elliptical plan shape.

On the other hand, the lower electrode 12 includes a slit 33 that penetrates from an upper surface to a lower surface of the lower electrode 12. The slit 33 is formed at a position corresponding to the slit 37 in the plan view. That is, the slit 33 and the slit 37 overlap in the plan view. In other words, the lower electrode 12 other than the slit 33 and the upper electrode 16 other than the slit 37 are overlapped. Further, an area of the slit 33 is preferably equal to an area of the slit 37 or larger than the area of the slit 37, however, no limitation is made hereto, and the area of the slit 33 may be smaller than the area of the slit 37. At this occasion, in the plan view, a slit with the larger area (for example, slit 33) is formed so as to include a slit with the smaller area (for example, slit 37) within its region.

According to Modification Example 1, the following advantageous effects can be achieved.

In the case of the upper electrode 16 having the slit 37, the upper electrode 16 is more prone to warping in the short direction than in a case of not having the slit 37. That is, upper electrode 16 having the slit 37 is more prone to curving in the short direction upon moving in a direction perpendicular to the substrate.

More specifically, upon drawing the upper electrode 16 toward the lower electrode 12, a driving voltage is applied to the lower electrode 12. Due to this, an electrostatic attraction is generated between the upper electrode 16 and the lower electrode 12, and the upper electrode 16 is drawn toward the lower electrode 12. At this occasion, firstly, the portion where the slit 37 is formed, that is, the center portion of the upper electrode 16 in the short direction is warped. Then, a size of a gap 50 between the center portion of the upper electrode 16 and the lower electrode 12 becomes small. Here, the electrostatic attraction is inversely proportional to a square of the size of the gap 50 formed between a main surface of the upper electrode 16 and a main surface of the lower electrode 12. Due to this, if the size of the gap 50 becomes smaller, a larger electrostatic attraction is generated. Due to this, the upper electrode 16 is more easily drawn toward the lower electrode 12. Further, by being pulled at the portion where the slit 37 is provided, the upper electrode 16 warps by forming a curve. Subsequently, a portion where the size of the gap 50 becomes small, that is, a portion where the large electrostatic attraction is generated expands gradually toward a peripheral portion in the short direction. Due to this, the upper electrode 16 can easily be drawn toward the lower electrode 12, and be brought into a down-state. That is, a reduction of the driving voltage can be achieved.

Next, upon separating the upper electrode 16 from the lower electrode 12, the application of the driving voltage to the lower electrode 12 is stopped. Due to this, the electrostatic attraction between the upper electrode 16 and the lower electrode 12 is released. Then, by the electrostatic voltage by the driving voltage becoming small, the upper electrode 16 is separated from the lower electrode 12. At this occasion, firstly, the peripheral portion of the upper electrode 16 separates from the lower electrode 12 by an elastic force of second spring portions 21. Then, the size of the gap 50 between the peripheral portion of the upper electrode 16 and the lower electrode 12 becomes large. Thus, the electrostatic attraction at the portion (peripheral portion) where the upper electrode 16 separated from the lower electrode 12 becomes small, and the upper electrode 16 can easily be separated from the lower electrode 12. Then, the upper electrode 16 warps by forming a curve by the upper electrode 16 being pulled by the portion separated from the lower electrode 12. Subsequently, at the portion where the size of the gap 50 becomes even larger, that is, the portion where the electrostatic attraction becomes even smaller gradually expands to the center portion in the short direction. Due to this, the upper electrode 16 can easily be separated from the lower electrode 12, to bring it into an up-state.

Notably, the area of the lower electrode 12 and the area of the upper electrode 16 may be at about the same size, the area of the lower electrode 12 may be smaller than the area of the upper electrode 16, and the area of the lower electrode 12 may be larger than the area of the upper electrode 16. In other words, the area of the slit 33 and the area of the slit 37 may be of about the same size, the area of the slit 33 may be larger than the area of the slit 37, and the area of the slit 33 may be smaller than the area of the slit 37.

More specifically, in considering making the contribution of the substantial capacity $C_{MEMS}$ large and the contribution of the parasitic capacitance $C_{PARA}$ small, it is preferable that the area of the lower electrode 12 and the area of the upper electrode 16 are of about the same size. Further, in considering making the contribution of the parasitic capacitance $C_{PARA}$ small, it is preferable that the area of the lower electrode 12 is made smaller than the area of the upper electrode 16. However, no limitation is made hereto, and the area of the lower electrode 12 and the area of the upper electrode 16 (the area of the slit 33 and the area of the slit 37) can suitably be set.

Modification Example 2

Next, Modification Example 2 of the structure of the MEMS element of the first embodiment will be described with reference to FIGS. 13, 14, and 15.

FIG. 13 is a plan diagram showing Modification Example 2 of the structure of the MEMS element of the first embodiment, which is a diagram primarily showing a structure of an upper electrode 16. FIG. 14 is a plan diagram showing Modification Example 2 of the structure of the MEMS element of the first embodiment, which is a diagram primarily showing a structure of a lower electrode 12. FIG. 15 is a cross sectional diagram showing Modification Example 2 of the structure of the MEMS element of the first embodiment, which is a cross sectional diagram along a line C-C in FIG. 13 and FIG. 14.

As shown in FIGS. 13, 14, and 15, in Modification Example 2, the upper electrode 16 includes holes 17 and a slit 37 that penetrate from an upper surface to a lower surface of the upper electrode 16. The holes 17 and the slit 37 are for removing the sacrificing layer 15 formed between the lower electrode 12 and the upper electrode 16 in a manufacturing process. That is, the sacrificing layer 15 can be removed by an isotropic etching via the holes 17 and the slit 37.

The slit 37 is formed to extend in a long direction of the upper electrode 16 in a plan view. Further, the slit 37 is formed at a center portion in a short direction of the upper electrode 16 in the plan view. The holes 17 are formed in a peripheral portion of the upper electrode 16 in the plan view. That is, the holes 17 are provided around the slit 37. Further, areas of the holes 17 are smaller than an area of the slit 37.

On the other hand, the lower electrode 12 includes a slit 33 that penetrates from an upper surface to a lower surface of the lower electrode 12. The slit 33 is formed at a position corresponding to the slit 37 in the plan view. That is, the slit 33 and the slit 37 overlap in the plan view. In other words, the lower electrode 12 other than the slit 33 and the upper electrode 16 other than the holes 17 and the slit 37 are overlapped. Further, an area of the slit 33 is preferably equal to an area of the slit 37 or larger than the area of the slit 37, however, no limitation is made hereto, and the area of the slit 33 may be smaller than the area of the slit 37. At this occasion, in the plan view, a slit with the larger area (for example, slit 33) is formed so as to include a slit with the smaller area (for example, slit 37) within its region.

According to Modification Example 2, advantageous effects similar to Modification Example 1 can be achieved.

Further, in Modification Example 2, the lower electrode 12 does not include holes 13 at positions corresponding to the holes 17 of the upper electrode 16. In other words, the lower electrode 12 only includes the slit 33 corresponding to the slit 37, of the holes 17 and the slit 37 of the upper electrode 16. This is because the slit 37 has a larger area than the holes 17. That is, in Modification Example 2, in order to reduce a parasitic capacitance in a MEMS element from a viewpoint of easiness of process, the slit 33 having the larger area and corresponding to the slit 37 is solely formed with priority on the lower electrode 12. Notably, from the viewpoint of easiness of process, it is preferable to form the holes 13 also at the positions corresponding to the holes 17 of the upper electrode 16, if possible.

Modification Example 3

Next, Modification Example 3 of the structure of the MEMS element of the first embodiment will be described with reference to FIGS. 16 and 17.

FIG. 16 is a plan diagram showing Modification Example 3 of the structure of the MEMS element of the first embodiment, which is a diagram primarily showing a structure of an upper electrode 16. FIG. 17 is a plan diagram showing Modification Example 3 of the structure of the MEMS element of the first embodiment, which is a diagram primarily showing a structure of a lower electrode 12.

As shown in FIGS. 16 and 17, in Modification Example 3, the upper electrode 16 includes a slit 37 that penetrates from an upper surface to a lower surface of the upper electrode 16. The slit 37 is for removing a sacrificing layer 15 formed between the upper electrode 16 and a lower electrode 12 in a manufacturing process. That is, the sacrificing layer 15 can be removed by an isotropic etching through the slit 37. The slit 37 is formed to extend in a long direction of the upper electrode 16 in a plan view. Further, the slit 37 is formed at a center portion in a short direction of the upper electrode 16 in the plan view. Further, the slit 37 opens one end of the upper electrode 16 in the long direction. In other words, the upper electrode 12 separates in the short direction at a side of the one end in the long direction by the slit 37.

On the other hand, the lower electrode 12 includes a slit 33 that penetrates from an upper surface to a lower surface of the lower electrode 12. The slit 33 is formed at a position corresponding to the slit 37 in the plan view. That is, the slit 33 and the slit 37 overlap in the plan view. In other words, the lower electrode 12 other than the slit 33 and the upper electrode 16 other than the slit 37 are overlapped. Further, an area of the slit 33 is preferably equal to an area of the slit 37 or larger than the area of the slit 37, however, no limitation is made hereto, and the area of the slit 33 may be smaller than the area of the slit 37. At this occasion, in the plan view, a slit with the larger area (for example, slit 33) is formed so as to include a slit with the smaller area (for example, slit 37) within its region.

Notably, an area of the slit 37 herein refers to a region defined by a broken line connecting end portions at the one end of the upper electrode 16 in the long direction as shown in FIG. 16. Further, an area of the slit 33 refers to a region defined by a broken line connecting end portions at one end of the lower electrode 12 in the long direction as shown in FIG. 17.

According to Modification Example 3, advantageous effects similar to Modification Example 1 can be achieved.

Modification Example 4

Next, Modification Example 4 of the structure of the MEMS element of the first embodiment will be described with reference to FIG. 18.

FIG. 18 is a plan diagram showing Modification Example 4 of the structure of the MEMS element of the first embodiment, which is a diagram primarily showing a structure of an upper electrode 16.

As shown in FIG. 18, in Modification Example 4, the upper electrode 16 includes holes 17 and a slit 37 that penetrate from an upper surface to a lower surface of the upper electrode 16. The holes 17 and the slit 37 are for removing the sacrificing layer 15 formed between the lower electrode 12 and the upper electrode 16 in a manufacturing process. That is, the sacrificing layer 15 can be removed by an isotropic etching via the holes 17 and the slit 37.

The slit 37 is formed to extend in a long direction of the upper electrode 16 in a plan view. Further, the slit 37 is formed at a center portion in a short direction of the upper electrode 16 in the plan view. Further, the slit 37 opens one end of the upper electrode 16 in the long direction. In other words, the upper electrode 12 separates in the short direction at a side of the one end in the long direction by the slit 37.

The holes 17 are formed in a peripheral portion of the upper electrode 16 in the plan view. That is, the holes 17 are provided around the slit 37. Further, areas of the holes 17 are smaller than an area of the slit 37. Further, among the plurality of holes 17, there may be a hole 17 that opens an end portion of the upper electrode 16. The hole 17 that opens the end portion of the upper electrode 16 for example opens the other end of the upper electrode 16 in the long direction. In other words, the upper electrode 12 is separated in the short direction at a side of the other end in the long direction by the hole 17. Notably, an area of the hole 17 that opens the end portion of the upper electrode 16 herein refers to a region defined by a broken line connecting end portions at the other end of the upper electrode 16 in the long direction as shown in FIG. 18.

On the other hand, a lower electrode 12 in Modification Example 4 has a similar structure as in FIG. 17 of Modification Example 3. That is, the lower electrode 12 includes a slit 33 that penetrates from an upper surface to a lower surface of the lower electrode 12. The slit 33 is formed at a position corresponding to the slit 37 in the plan view.

According to Modification Example 4, advantageous effects similar to Modification Example 2 can be achieved.

Modification Example 5

Next, Modification Example 5 of the structure of the MEMS element of the first embodiment will be described with reference to FIG. 19.

FIG. 19 is a plan diagram showing Modification Example 5 of the structure of the MEMS element of the first embodiment, which is a diagram primarily showing a structure of an upper electrode 16.

As shown in FIG. 19, in Modification Example 5, the upper electrode 16 includes a slit 37 and slits 47 that penetrate from an upper surface to a lower surface of the upper electrode 16. The slit 37 and the slits 47 are for removing a sacrificing layer 15 formed between the upper electrode 16 and a lower electrode 12 in a manufacturing process. That is, the sacrificing layer 15 can be removed by an isotropic etching through the slit 37 and the slits 47.

The slit 37 is formed to extend in a long direction of the upper electrode 16 in a plan view. Further, the slit 37 is formed at a center portion in a short direction of the upper electrode 16 in the plan view.

The slits 47 are formed to extend in a short direction of the upper electrode 16 in the plan view, and intersect with the slit 37. Further, for example, three slits 47 are formed. The three slits 47 are respectively formed for example to intersect with one end portion, a center portion, and another end portion of the slit 37 in the long direction in the plan view.

On the other hand, the lower electrode 12 in Modification Example 5 has a similar structure to that in FIG. 14 of Modification Example 2. That is, the lower electrode 12 includes a slit 33 that penetrates from an upper surface to a lower surface of the lower electrode 12. The slit 33 is formed at a position corresponding to the slit 37 in the plan view.

According to Modification Example 5, similar advantageous effects as in Modification Example 2 can be achieved.

Further, according to Modification Example 5, the upper electrode 16 includes the slits 47. The slits 47 achieve similar advantageous effects as the advantageous effects of the slit 37 in the short direction. That is, compared to Modification Example 2, the upper electrode 16 can more easily be drawn toward the lower electrode 12 to assume a down-state, and a further reduction of a driving voltage can be achieved. Further, the upper electrode 16 can more easily be separated from the lower electrode 12, to bring it into an up-state.

Second Embodiment

A MEMS element of the second embodiment will be described with reference to FIGS. 20, 21, 22, 23, and 24. In the second embodiment, dummy electrodes 41 are provided at center portions of holes 13 in a lower electrode 12. Due to this, flatness of a sacrificing layer 15 can be improved, and an upper electrode 16 can be formed into a desired shape. Hereinbelow, the second embodiment will be described in detail. Notably, in the second embodiment, description of points similar to the above first embodiment will be omitted, and points that are different will primarily be described.

[Structure]

Firstly, the structure of the MEMS element of the second embodiment will be described with reference to FIGS. 20, 21, and 22.

FIG. 20 is a plan diagram showing the structure of the MEMS element of the second embodiment, which is a diagram primarily showing a structure of the upper electrode 16. FIG. 21 is a plan diagram showing the structure of the MEMS element of the second embodiment, which is a diagram primarily showing a structure of the lower electrode 12. FIG. 22 is a cross sectional diagram showing the structure of the MEMS element of the second embodiment, which is a cross sectional diagram along a line D-D in FIGS. 20 and 21.

As shown in FIGS. 20, 21, and 22, in the second embodiment, a point that differs from the above first embodiment is that the dummy electrodes 41 are provided in the center portions of the holes 13 in the lower electrode 12.

More specifically, the dummy electrodes 41 are formed at the center portions of the holes 13 of an interlayer insulating layer 11. The dummy electrodes 41 are formed simultaneously as the lower electrode 12. Due to this, the dummy electrodes 41 are formed at the same level as the lower electrode 12, and are configured of the same material as the lower electrode 12. Further, the dummy electrodes 41 are insulated from the lower electrode 12, and are in a floating state. In other words, grooves 42 are formed between the dummy electrodes 41 and the lower electrode 12, and the dummy electrodes 41 and the lower electrode 12 are isolated by lower electrode protecting layers 14 being formed in the grooves 42.

[Manufacturing Method]

Next, a manufacturing method of the MEMS element of the second embodiment will be described with reference to FIGS. 23 and 24. Here, a forming method of the holes 13 (grooves 42) provided in the lower electrode 12 and holes 17 provided in the upper electrode 16 will primarily be described.

FIGS. 23 and 24 are cross sectional diagrams showing the manufacturing process of the MEMS element of the second embodiment, which are cross sectional diagrams along the line D-D in FIGS. 20 and 21.

Firstly, the step of FIG. 4 in the first embodiment is formed. That is, the interlayer insulating layer 11 and a metal layer 12a are formed in order on a semiconductor substrate 10.

Next, as shown in FIG. 23, the metal layer 12a is patterned for example by lithography and RIE. Due to this, the lower electrode 12 is formed on the interlayer insulating layer 11. Further, concurrently, dummy electrodes 22, and wirings 26, 27 are formed on the interlayer insulating layer 11.

At this occasion, the holes 13 that penetrate from the upper surface to the lower surface are formed in the lower electrode 12, and the dummy electrodes 41 are formed at the center portions of the holes 13. In other words, the grooves 42 are formed between the lower electrode 12 and the dummy electrodes 41 so that they are isolated.

The dummy electrodes 41 in the holes 13 are formed in consideration of the flatness of the sacrificing layer 15 to be formed later, and a coupling capacity with the lower electrode 12. That is, the dummy electrodes 41 are formed such that their plan size becomes large enough to a degree by which the coupling capacity of the dummy electrodes 41 and the lower electrode 12 can be ignored. In other words, the grooves 42 are formed such that their plan size (width) becomes small enough to the degree by which the coupling capacity of the dummy electrodes 41 and the lower electrode 12 can be ignored.

Next, as shown in FIG. 24, a lower electrode protecting layer 14 is formed on an entire surface for example by a P-CVD method. Due to this, surfaces of the lower electrode 12, the dummy electrodes 22, 41, and the wirings 26, 27 are covered by the lower electrode protecting layer 14. Thereafter, the lower electrode protecting layer 14 is etched for example by the lithography and the RIE. Due to this, the opening portions are formed in the lower electrode protecting layer 14 positioned above the wiring 26 and the dummy electrodes 22, whereby the wiring 26 and the dummy electrodes 22 are exposed. Notably, at this occasion, the dummy electrodes 22 may not be exposed.

Next, the sacrificing layer 15 is applied on the lower electrode protecting layer 14. The sacrificing layer 15 is configured of an organic material such as polyimide. At this occasion, the dummy electrodes 41 are formed in the holes 13 of the lower electrode 12. Due to this, the sacrificing layer 15 is formed flat without forming recessed portions above the holes 13.

Thereafter, the sacrificing layer 15 is patterned for example by the lithography and the RIE. Due to this, the sacrificing layer 15 above the opening portions of the lower electrode protecting layer 14 is etched, and the wiring 26 and the dummy electrodes 22 are exposed. In other words, opening portions that connect with the opening portions of the lower electrode protecting layer 14 are formed in the sacrificing layer 15.

Next, a metal layer is formed on an entire surface for example by a sputtering method. More specifically, the metal layer is formed on an upper surface of the sacrificing layer 15 outside the opening portions, and on side surfaces of the sacrificing layer 15 (and the lower electrode protecting layer 14) within the opening portions.

Next, the metal layer is patterned for example by the lithography and a wet etching. Due to this, the upper electrode 16 that opposes the lower electrode 12 is formed on the sacrificing layer 15. Further, second anchoring portions 23 are formed on the dummy electrodes 22 in the opening portions. Further, first anchoring portion 25 is formed on the wiring 26 in the opening portion, and a first spring portion 24 that connects the upper electrode 16 and the first anchoring portion 25 is formed on the sacrificing layer 15.

At this occasion, holes 17 that penetrate from the upper surface to the lower surface are formed in the upper electrode 16. The holes 17 are formed at the positions corresponding to the holes 13 formed in the lower electrode 12.

Next, after when a layer configured of the brittle material is formed on an entire surface for example by the P-CVD method, the layer configured of the brittle material is etched by the lithography and the RIE. Due to this, second spring portions 21 connected to the upper electrode 16 and the second anchoring portions 23 are formed.

Next, as shown in FIG. 22, the sacrificing layer 15 is removed via end portion sides and the holes 17 by an isotropic dry etching such as ashing using $O_2$ and Ar. Due to this, the first spring portion 24, the second spring portion 21, and the upper electrode 16 are formed to be in a midair state.

Accordingly, the MEMS element of the second embodiment is formed.

Advantageous Effects

According to the above second embodiment, advantageous effects similar to the first embodiment can be achieved.

Further, in the second embodiment, the dummy electrodes 41 are provided at the center portions of the holes 13 in the lower electrode 12. Due to this, the following advantageous effect can be achieved.

FIG. 25 is a cross sectional diagram showing a manufacturing process of a MEMS element of a comparative example 2.

As shown in FIG. 25, in the manufacturing process of the MEMS element in the comparative example 2, when a sacrificing layer 15b is formed after having formed a lower electrode 12 including holes 13, recessed portions are sometimes formed above the holes 13 in the sacrificing layer 15b. That is, flatness of the sacrificing layer 15b is deteriorated. If an upper electrode 16b having holes 17b is formed on the sacrificing layer 15b having the recessed portions, the upper electrode 16b with a desired shape cannot be formed. As a result, when the upper electrode 16b of the MEMS element assumes a down-state, the upper electrode 16b and a lower electrode protecting layer 14 do not come into tight contact, where a gap is formed, and a desired property cannot be obtained.

In regards to this, in the second embodiment, the dummy electrodes 41 are provided in the holes 13 of the lower electrode 12. Due to this, recessed portions are not formed in the sacrificing layer 15 to be formed on the lower electrode 12, and the flatness of the sacrificing layer 15 can be improved.

Notably, the second embodiment can be adapted to Modification Example 1 to Modification Example 5 of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A MEMS element comprising:
a first electrode fixed on a substrate; and
a second electrode arranged above the first electrode, facing the first electrode, and vertically movable;
wherein the second electrode includes a second opening portion that penetrates from an upper surface to a lower surface of the second electrode, and
wherein the first electrode includes a first opening portion at a position corresponding to at least a part of the second opening portion, the first opening portion penetrating from an inner part of an upper surface to an inner part of a lower surface of the first electrode, and the first opening portion being entirely surrounded by the first electrode.

2. The element of claim 1, wherein an area of the first opening portion is equal to an area of the second opening portion or is larger than the area of the second opening portion in a plan view.

3. The element of claim 2, wherein the first opening portion includes the second opening portion in the plan view.

4. The element of claim 1, wherein the second opening portion includes second holes, and the first opening portion includes at least one first hole formed at a position corresponding to at least a part of one or more of the second holes.

5. The element of claim 1, wherein the second opening portion includes a second slit and second holes, and the first opening portion includes a first slit formed at a position corresponding to at least a part of the second slit.

6. The element of claim 1, wherein the second opening portion includes a second slit and a third slit that intersects with the second slit, and the first opening portion includes a first slit formed at a position corresponding to at least a part of the second slit.

7. The element of claim 6, wherein the second slit extends in a long direction of the second electrode in a plan view, and the third slit extends in a short direction of the second electrode in the plan view.

8. A MEMS element comprising:
a first electrode fixed on a substrate;
a second electrode arranged above the first electrode, facing the first electrode, and vertically movable, wherein the second electrode includes a second opening portion that penetrates from an upper surface to a lower surface of the second electrode, and wherein the first electrode includes a first opening portion at a position corresponding to at least a part of the second opening portion, the first opening portion penetrating from an upper surface to a lower surface of the first electrode; and
a dummy electrode disposed at a center portion of the first opening portion in a plan view and separated from the first electrode.

9. The element of claim 8, wherein the dummy electrode is formed at a same level as the first electrode, and includes a same material as the first electrode.

10. A MEMS element comprising:
a first electrode fixed on a substrate; and
a second electrode arranged above the first electrode, facing the first electrode, and vertically movable;
wherein the second electrode includes a second opening portion that penetrates from an upper surface to a lower surface of the second electrode,
wherein the first electrode includes a first opening portion at a position corresponding to at least a part of the second opening portion, the first opening portion penetrating from an upper surface to a lower surface of the first electrode, and
wherein the second opening portion includes a second slit, and the first opening portion includes a first slit formed at a position corresponding to at least a part of the second slit.

11. The element of claim 10, wherein the second slit extends in a long direction of the second electrode in a plan view.

12. The element of claim 10, wherein the second slit is formed at a center portion of the second electrode in a short direction in a plan view.

13. The element of claim 10, wherein the second slit opens an end portion of the second electrode in a plan view.

* * * * *